United States Patent [19]

Oehrlein et al.

[11] Patent Number: 5,153,813
[45] Date of Patent: Oct. 6, 1992

[54] HIGH AREA CAPACITOR FORMATION USING DRY ETCHING

[75] Inventors: Gottlieb S. Oehrlein, Yorktown Heights; Gary W. Rubloff, Waccabuc, both of N.Y.

[73] Assignee: International Business Machines Corporation, Armonk, N.Y.

[21] Appl. No.: 785,739

[22] Filed: Oct. 31, 1991

[51] Int. Cl.$^5$ .................. H01G 4/06; H01L 29/78; H01L 21/70
[52] U.S. Cl. ...................... 361/313; 437/52; 357/23.6
[58] Field of Search ............... 361/311-313; 437/52; 357/51, 23.6

[56] References Cited

U.S. PATENT DOCUMENTS

| | | | |
|---|---|---|---|
| 4,475,982 | 10/1984 | Lai et al. | 156/643 |
| 4,601,778 | 7/1986 | Robb | 156/628 |
| 4,853,348 | 8/1989 | Tsubouchi et al. | 437/203 |
| 4,906,590 | 3/1990 | Kanetaki et al. | 437/52 |
| 4,943,344 | 7/1990 | Tachi et al. | 156/643 |
| 5,095,346 | 3/1992 | Bae et al. | 357/23.6 |
| 5,102,817 | 4/1992 | Chatterjee et al. | 437/47 |

FOREIGN PATENT DOCUMENTS

| | | |
|---|---|---|
| 59-191333 | 10/1984 | Japan . |
| 60-173871 | 9/1985 | Japan . |
| 60-176265 | 9/1985 | Japan . |
| 60-224261 | 11/1985 | Japan . |

OTHER PUBLICATIONS

P. M. Schaible and G. C. Schwartz, IBM Technical Disclosure Bulletin, vol. 22, No. 5, p. 1819 (Oct. 1979).
P. M. Schaible and G. C. Schwartz, IBM Technical Disclosure Bulletin, vol. 21, No. 7, pp. 2814-2815 (Dec. 1978).

*Primary Examiner*—Donald Griffin
*Attorney, Agent, or Firm*—Heslin & Rothenberg

[57] ABSTRACT

The invention provides a method of increasing the capacitance of a capacitor which comprises forming a capacitor having a main vertical trench and one or more lateral trenches extending off the main vertical trench. The capacitor has alternating first and second silicon regions, for example n-doped and p-doped silicon regions. After a main vertical trench is dry etched through the first and second silicon regions, the etch characteristics of the alternating first and second silicon regions are utilized to selectively dry etch lateral trenches, thereby increasing the surface area of the capacitor and the capacitance of the capacitor. Capacitors produced by this method are also provided.

25 Claims, 1 Drawing Sheet

HIGH AREA CAPACITOR FORMATION USING DRY ETCHING

TECHNICAL FIELD

This invention relates to a method of fabricating high area capacitors for use in the semiconductor industry, and more particularly to a method of fabricating capacitors having lateral trenches extending from a main vertical trench using dry etching. The lateral trenches are formed by utilizing the dry etch characteristics of doped and/or undoped silicon.

BACKGROUND ART

The technology of producing semiconductor devices has been continually pressured to increase effective device densities in order to remain cost competitive. As a result, Very Large Scale Integration (VLSI) and Ultra Large Scale Integration (ULSI) technologies have entered the sub-micron realm of structural dimension and now are approaching physical limits in the nanometer feature size range. In the foreseeable future, absolute atomic physical limits will be reached in the conventional two-dimensional approach to semiconductor device design. Traditionally, dynamic random access memory (DRAM) designers have faced the severest of challenges in advancing technologies. For example, designers of 64K DRAMs were perplexed to learn that a practical physical limit to charge capacity of storage capacitors had already been reached due to the minimum charge necessary to sense signals in the presence of environmental or particulate radiation inherently present in fabrication materials. Storage capacitors in the range of 50 femtofarads are now considered to be a physical limit. From a practical view, this limitation prevented the scaling of DRAM capacitors. Reduction of the surface area of a semiconductor substrate utilized by the storage capacitor has also been severely restricted. Due to decreases in the thickness of capacitor materials, existing 1 Megabit (1 Mbit) DRAM technologies utilize a planar device in circuit design. Beginning with 4M bit DRAMs, the world of three-dimensional design has been explored to the extent that the simple single device/capacitor memory cell has been altered to provide the capacitor in a vertical dimension. In such designs the capacitor has been formed in a trench in the surface of the semiconductor substrate. In yet denser designs, other forms of capacitor design are proposed, such as stacking the capacitor above the transfer device.

The progress of DRAM technology, which in many ways drives micro-electronics technology, is thus currently limited in significant part by the difficulty of fabricating storage capacitors with sufficient capacitance within decreasing area on the chip. The DRAM world is currently divided between two paths, with some manufacturers pursuing trench capacitors built into the crystalline silicon wafer, and other manufacturers pursuing stacked capacitors in which the capacitor is fabricated on top of the wafer surface. The use of a stacked capacitor permits a variety of new process options, for example, in the choice of electrode material (polysilicon, silicide, etc.). In the case of the trench capacitor, its extendibility is in doubt since it is extremely difficult to etch about 0.15–0.25 micrometer wide trenches well over 10 micrometers deep, as well as to then fabricate ultrathin dielectric layers on the trench surface, fill the trench, etc.

Various attempts have been made to fabricate capacitors having a larger surface area than conventional capacitors. Tsubouchi et al. in U.S. Pat. No. 4,853,348 discloses a capacitor comprising a capacitor hole formed in a p type semiconductor substrate and an n type semiconductor region provided along the capacitor hole so that the pn junction area therebetween is increased and the capacitance is made large.

G. C. Schwartz and P. M. Schaible, J. Vac. Sci. & Technol. 16: 410 (1979) disclose the spontaneous reactive ion etching in chlorine of n-doped silicon without sidewall passivation. The spontaneous etching produces a structure having lateral fins extending from an etched vertical trench if the n-doped silicon extends laterally away from the vertical trench as the vertical trench is etched using chlorine.

This lateral fin formation in the presence of chlorine is also referred to as "blooming" in Lai et al., U.S. Pat. No. 4,475,982, but the Lai et al. Patent is directed to a method of etching which prevents lateral etching or blooming in heavily doped semiconductor regions.

K. Nakamura in Japanese Patent Application Publication No. JP 60-173871, published Sep. 7, 1985, discloses a semiconductor memory device manufactured by forming a groove and several projections from the groove in a semiconductor substrate to increase the surface area of the groove.

M. Nakamae in Japanese Patent Application Publication No. JP 60-176265, published Sep. 10, 1985, discloses a semiconductor memory device having large capacitance which is fabricated by directionally dry etching a small hole in the main surface of a semiconductor substrate. The silicon substrate is then doped and directional dry etching is used to etch sideways from the small hole to form a buried cavity having a width wider than the small hole.

Despite the fabrication of these various capacitor structures, a need continues to exist in the art for a capacitor having a large surface area so that the capacitor's capacitance is increased, without increasing the area occupied by the capacitor structure on or in a silicon substrate.

DISCLOSURE OF INVENTION

It is thus an object of the invention to provide a method of increasing the capacitance of a capacitor by fabricating a capacitor having a large surface area, and therefore increased capacitance as compared to previously available capacitors, without increasing the area occupied by the capacitor structure on or in a silicon substrate.

Briefly described, the present invention provides a method of increasing the capacitance of a capacitor which comprises forming a capacitor having alternating first and second silicon regions. The etch characteristics of the first and second silicon regions are exploited to selectively etch laterally either the first or second silicon regions, with the resulting lateral trenches providing increased surface area for the capacitor, thereby increasing the capacitance of the capacitor without increasing the area occupied by the capacitor. The etching of a main vertical trench from which the lateral trenches extend, and the selective lateral etch of the lateral trenches, each utilize dry etching techniques which offer an advantage over previous etching techniques. Specifically, an all dry etching process for capacitor formation allows the use of integrated processing tools used in the advanced tooling strategies characteristic of today's art. By utilizing an all dry etching process, the semiconductor device being formed is kept from exposure to air and other contaminating substances which is not possible if the semiconductor device is removed from a processing tool in order to perform wet etching. The all dry etching process can even be performed in one step, with the vertical and lateral etchings taking place simultaneously without the use of successive sidewall coating or masking. This one-step dry etching process provides an additional advantage over two-step processes.

The lateral trenches extending from the main trench are preferably fabricated with reactive ion etching (RIE) using chlorine chemistry in combination with As (or P) ion implantation which controls the depth and lateral extent of the trenches. Specifically, As (or P) ions are implanted at different energies to various depths in a Si substrate in accordance with the desired size and locations of the lateral trenches, and then RIE etching without sidewall passivation is performed. During the etching, the main vertical trench is formed and due to removal of the As doped regions in the trench sidewall by attack from the Cl chemistry, the lateral trenches are simultaneously produced. As the attack of chlorine on n-type Si is very highly selective, precise removal of the n-type Si layers is possible.

Also provided is a method for the fabrication of stacked capacitors for DRAMs involving successively alternating thin layers of n-type (As or P dopant) and p-type (B dopant) polysilicon on the surface of a wafer, using in-situ doping and UHV-CVD, and then patterning to define the central region of a vertical via-like structure (main vertical trench). The patterning is by highly anisotropic dry etching without sidewall passivation, and then the exposed n-doped layers' sidewalls are etched laterally using a selective isotropic dry etch chemistry. Variations are possible on these steps and materials, such as continuous p-doping throughout the multilayer structure with alternating n+ doping, and combining the vertical and lateral etching using the chlorine chemistry disclosed above.

The invention further provides capacitors produced by the disclosed method.

BRIEF DESCRIPTION OF DRAWINGS

The foregoing and other objects, features and advantages of the invention will be apparent from the following more particular description of preferred embodiments of the invention as illustrated in the accompanying drawings in which.

BEST MODE FOR CARRYING OUT THE INVENTION

Figure 1A:
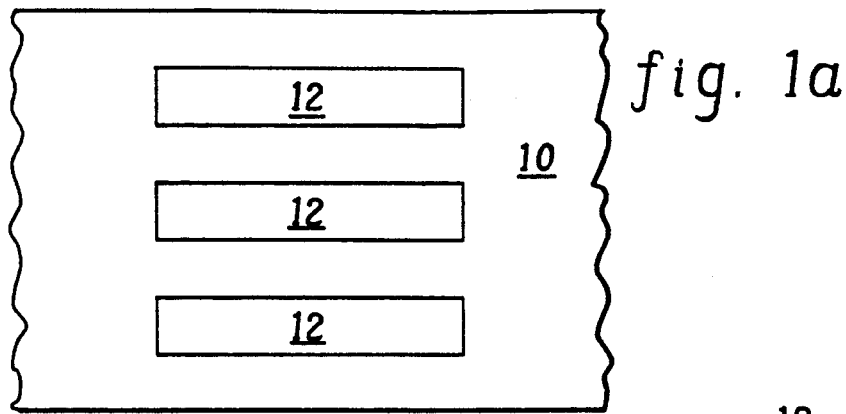
FIG. 1 illustrates a trench capacitor structure having a large surface area. In the cross sectional view of FIG. 1a, portions of the silicon substrate are doped. In the cross sectional view of FIG. 1b, the doped portions of the silicon substrate are simultaneously etched by chlorine when a vertical trench is etched using the chlorine.

As used in the subject application, doping refers to the addition of impurities to a semiconductor material. Doping allows the manufacture of n-type and p-type semiconductors with varying degrees of conductivity. In general, the greater the extent of doping, the higher the conductivity.

An n-type material refers to a semiconductor material that has been doped with a donor-type impurity and, consequently, conducts a current via electrons. A p-type material refers to a semiconductor material that has been doped with an acceptor-type impurity and, consequently, conducts current via hole migration.

Etching refers to chemically eating away a material to form a desired pattern as an etched circuit; for example, an etched circuit can be produced by etching the material coating of a substrate to provide the required pattern of conductors and terminals to which discrete components are soldered. Selectively etching refers to the use of etching, for example, in the manufacture of circuits, to remove selected portions of one material from another in a semiconductor or capacitor structure.

A capacitor refers to a passive electronic circuit component consisting of, in basic form, two metal electrodes or plates separated by a dielectric (or insulator). Capacitance, measured in the unit farad, refers to the property exhibited by two conductors separated by a dielectric, whereby an electric charge becomes stored between the conductors. A trench capacitor refers to a capacitor formed in a trench in the surface of a semiconductor substrate. A stacked capacitor refers to a capacitor formed by stacking the capacitor in a vertical or other non-planar orientation above the semiconductor substrate. In a capacitor, a lateral trench refers to a trench extending laterally from a vertical trench situated in the capacitor device.

RIE refers to reactive ion etching. ECR refers to electron cyclotron resonance etching. Passivation refers to the process of growing a thin oxide film on the surface of a planar semiconductor device to protect the exposed junction(s) from contamination and shorts, with sidewall passivation referring to this process in relation to sidewalls.

CVD refers to chemical vapor deposition, with chemical deposition being the coating of a surface with a substance resulting from chemical reduction of a solution. Ion implantation refers to the implantation of ions, for example, for doping a semiconductor substrate.

Epitaxial growth refers to growing monocrystalline silicon on a silicon wafer by depositing silicon from a silicon-containing source (e.g. $SiH_4$, "silane") onto a wafer in a chamber in which temperature, atmosphere, flow and geometry are carefully controlled.

Epitaxy refers to the condition in which atoms in a thin film of single crystal material grown on the surface of the same material continue their characteristic alignment. Epitaxial silicon atoms are arranged in a perfect array and therefore exhibit an inherent symmetry in arrangement and orientation.

Silicon, as used in this application, includes polysilicon (polycrystalline silicon), amorphous silicon (non-crystalline silicon), and microcrystalline silicon.

The broad concept of the subject invention is directed to a method of increasing the capacitance of a capacitor which comprises forming a capacitor having alternating first and second silicon regions. The first silicon region has different etch characteristics than the second silicon region, allowing for selective etching of the two regions. Dry etching is used to vertically etch a main vertical trench in the capacitor through the first and second silicon regions. Dry etching is then also used to laterally etch lateral trenches off the main vertical trench. This is accomplished by selectively laterally dry etching one of the first and second silicon regions. The surface area of the capacitor is thereby increased so as to increase capacitance of the capacitor.

The capacitor may be a trench capacitor or a stacked capacitor. In a stacked capacitor of the subject invention, the alternating first and second silicon regions preferably comprise alternating layers of the first and second silicon regions.

The alternating first and second silicon regions are chosen so as to result in different etch characteristics of the two regions, so that one region can be selectively etched without etching the other region. Preferred combinations of first and second silicon regions are an undoped silicon region and an n-doped silicon region, an n-doped silicon region and a p-doped silicon region, and an n- and p-doped silicon region and a p-doped silicon region.

Depending upon the etch characteristics desired, the doped silicon may be p-doped, such as silicon doped with boron, or n-doped, such as silicon doped with arsenic or phosphorus.

Any suitable means of dry etching known to those skilled in the art can be utilized to fabricate the capacitor. The choice of first and second silicon regions will dictate in part suitable dry etching means. Examples of dry etching include anisotropic or isotropic dry etching, such as reactive ion etching, with or without sidewall passivation. Another suitable etching process is electron cyclotron resonance etching. Examples of suitable etchant gases, also known to those skilled in the art, include $SF_6$. It is also possible to etch the main vertical trench simultaneously with the etching of the lateral trenches, such as by using chlorine chemistry.

The alternating first and second silicon regions may be formed by any means known to those skilled in the art. Suitable means for doping the silicon regions are also known to those skilled in the art, and include, for example, ion implantation and in-situ doping during chemical vapor deposition. Layers forming the first and second silicon regions may also be epitaxially deposited.

The invention is further directed to capacitors having increased capacitance produced by the above method. More particularly, the capacitors of the subject invention are produced by forming alternating first and second silicon regions. The first silicon region has different etch characteristics than the second silicon region, with preferred first and second regions being a p-doped silicon region and an n-doped silicon region, a p-doped silicon region and a p-doped silicon region which is also n-doped, and an n-doped silicon region and an undoped silicon region. The capacitors are produced by dry etching a main vertical trench in the capacitor by etching vertically through the first and second silicon regions. Lateral trenches are then selectively laterally dry etched off the main vertical trench, by selectively etching either the first or second silicon regions. These lateral trenches increase the surface area of the capacitor, thereby increasing the capacitance of the capacitor.

These aspects of the invention will be more readily understood by the examples of preferred embodiments which follow.

EXAMPLE 1

In one embodiment, the invention provides a method of fabricating a trench capacitor with increased capacitance density by etching laterally small trenches into the sidewalls of the vertical trench. Reactive ion etching using chlorine chemistry in conjunction with arsenic (As) ion or phosphorus (p) ion implantation to control the depth and lateral extent of the lateral trenches is used to form these structures. As the number of lateral trenches and their depth is increased the total area of the resulting capacitor structure goes up and the need for etching a deep trench is relaxed.

Increasing the capacitance density of a trench capacitor by forming lateral "fins" has not previously been proposed for a trench capacitor because of the apparent inability to fabricate this structure in one processing step or by a sequence of all dry etching processes. However, a novel dry etching technology for fabricating such a structure is disclosed herein.

It is well known that reactive ion etching of intrinsic and p-type Si using chlorine, even without sidewall passivation, is directional. On the other hand, etching of n-doped Si without sidewall passivation occurs spontaneously in chlorine. These differing etch characteristics of silicon can be utilized to fabricate with a great degree of control the structure shown in FIG. 1.

Figure 1B:
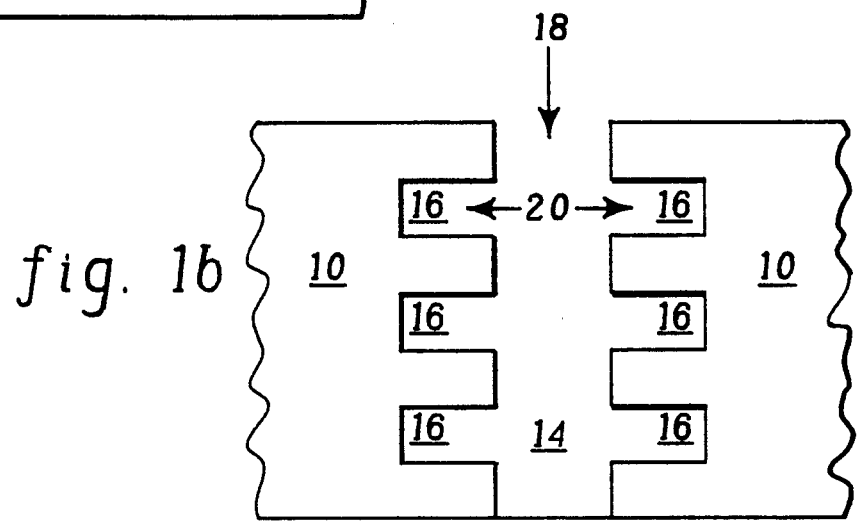

Initially, as shown in FIG. 1a, As (or P) ions 12 are implanted at different energies to various depths into the silicon 10. The energy of the As ions 12 (or P ions) is chosen according to the desired locations of the lateral trenches. The depth of these layers can be large enough so as not to interfere with other device parts close to the Si surface. The lateral extent of the lateral trench is controlled by the ion implantation masking. Subsequently the trench is masked and reactive ion etching 18 without sidewall passivation is performed. In this step the vertical trench 14 is etched. At the same time the As (or P-doped) regions 12 are removed by lateral attack 20 of the Cl chemistry. FIG. 1b shows that there is a very high selectivity in the attack of chlorine of n-type Si relative to intrinsic or p-type Si and the precise removal of the n-type Si layers is possible. Ultimately a structure as shown in FIG. 1b is produced in this fashion.

The lateral attack of chlorine is only slightly slower than the vertical etch rate, i.e. about half. It is possible, therefore, to easily etch lateral trenches 0.5 $\mu$m deep if the vertical etch depth is of the order of 5 $\mu$m or more (as necessary in practice).

EXAMPLE 2

In another embodiment, the invention provides a high area stacked capacitor formation using in-situ doped poly Si and isotropic/anisotropic dry etching. The formation of the high area/density stacked capacitor structures is enabled by exploiting: (i) low temperature Si deposition of very thin alternately doped layers; and (ii) alternating anisotropic and isotropic dry etching processes to fabricate the stacked capacitor.

Figure 2A:
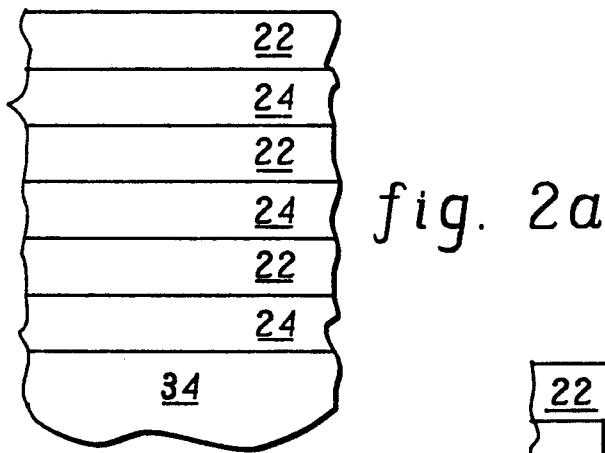
FIG. 2 illustrates a stacked capacitor structure having a large surface area. In the cross sectional view of FIG. 2a, alternating layers of silicon and n-doped silicon are shown. In the cross sectional view of FIG. 2b, the doped portions of the silicon substrate are etched subsequent to the etching of the vertical trench.

As indicated in FIG. 2a, alternating layers of n-type 24 and p-type 22 polysilicon are deposited on the surface of a wafer 34, using in-situ doping in which the n-dopant is As or P and the p-dopant is B. The individual layers are fabricated as ultrathin structures (e.g., about 300–500 Å) using low temperature ultrahigh vacuum chemical vapor deposition (UHV/CVD) processing, which permits the deposition of high electrically-active doping concentrations at very low temperatures ($\geq 450°$ C.) without thermal smearing of abrupt profiles. These ultrathin layers later translate into high area stacked capacitor structures.

An alternative doping sequence could involve continuous p-doping throughout the multilayer structure and alternating n+ doping, leading to equivalent n-type/p-type multilayer structures. This alternative requires rapid control of only one of the dopant gases, rather than two.

Deposition of the multilayer structure is then followed by patterning to form a main vertical trench 26 in the multilayer structure. Using patterns which incorporate minimum feature sizes characteristic of the technology generation, this main vertical trench 26 is formed using highly anisotropic dry etching 30 (reactive ion etching) without use of sidewall passivation, as shown in FIG. 2b.

Figure 2B:
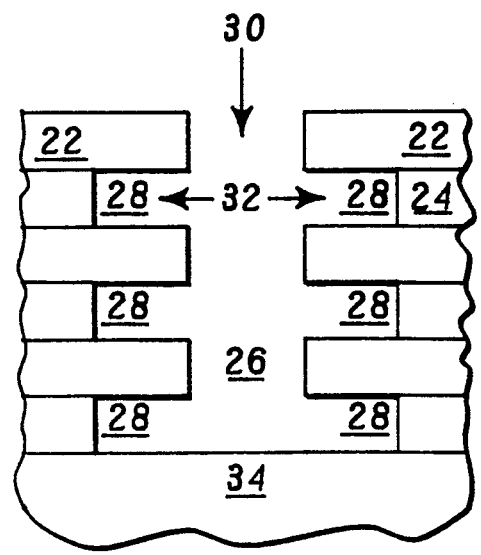

Next the n-dopant layers which now have exposed sidewalls are etched laterally 32 using an isotropic etch chemistry which selectively attacks n-doped Si 24 (and not intrinsic or p-doped material), as also depicted in FIG. 2b.

This lateral etching step provides a considerably larger surface area for the structure, which leads to higher capacitance per unit chip area than could be achieved merely by lithographic definition at a given minimum feature size.

It is also possible to combine the vertical and lateral etching by an appropriate choice of etch chemistry; e.g., chlorine will accomplish simultaneous vertical etching and selective lateral etching of n-doped Si.

Following the combination of anisotropic and selective isotropic etching to form fin-like stacked capacitor shapes, conformal dielectric deposition and subsequent via filing (e.g., polySi CVD) are used to create the capacitor device as commonly done in DRAM technology.

Although directed at polySi stacked capacitor structures, the same approach could be used with deposition of microcrystalline (i.e., nearly amorphous) Si multilayers, e.g. as can result from low temperature plasma-enhanced CVD as well as from thermal CVD. Alternatively, the combination cited here—low temperature UHV/CVD and dual etching—could in fact be applied to trench capacitor structures. Finally, one could utilize selective Si epitaxy to grow single-crystal Si films above the wafer surface at low temperature ($\leq 600°$ C.), with in-situ doping, in order to obtain better control over processing issues associated with grain boundary structures in polySi.

While the invention has been particularly shown and described with reference to preferred embodiments thereof, it will be understood by those skilled in the art that various changes in form and details may be made therein without departing from the spirit and scope of the invention.

We claim:

1. A method of increasing the capacitance of a capacitor which comprises:
   forming a capacitor having alternating first and second silicon regions, said first silicon region having different etch characteristics from said second silicon region;
   dry etching a main vertical trench in said capacitor by etching vertically through said first and said second silicon regions; and
   dry etching lateral trenches off said main vertical trench by selectively laterally dry etching one of said first and said second silicon regions, thereby increasing surface area of said capacitor so as to increase capacitance of said capacitor.

2. The method of claim 1 wherein said capacitor comprises a trench capacitor.

3. The method of claim 1 wherein said capacitor comprises a stacked capacitor.

4. The method of claim 3 wherein said alternating regions comprise alternating layers of said first and second silicon regions.

5. The method of claim 1 wherein at least one of said first and said second silicon regions of said capacitor comprises doped silicon.

6. The method of claim 5 wherein said doped silicon comprises p-doped silicon.

7. The method of claim 6 wherein said first silicon region comprises p-doped silicon and said second silicon region comprises n-doped silicon.

8. The method of claim 6 wherein said first silicon region comprises p-doped silicon and said second silicon region comprises p-doped silicon which is also n-doped.

9. The method of claim 6 wherein said p-doped silicon comprises silicon doped with boron.

10. The method of claim 5 wherein said doped silicon comprises n-doped silicon.

11. The method of claim 10 wherein said first silicon region comprises n-doped silicon and said second silicon region comprises undoped silicon.

12. The method of claim 10 wherein said n-doped silicon comprises silicon doped with arsenic or phosphorus.

13. The method of claim 5 wherein said doped silicon comprises p-doped silicon which is also n-doped.

14. The method of claim 5 wherein formation of said doped silicon comprises in situ doping during chemical vapor deposition.

15. The method of claim 5 wherein formation of said doped silicon comprises ion implantation of a dopant into said silicon.

16. The method of claim 1 wherein said one of said first and second silicon regions of said capacitor comprises n-doped.

17. The method of claim 1 wherein said etching of said main vertical trench comprises anisotropic dry etching.

18. The method of claim 17 wherein said anisotropic dry etching comprises reactive ion etching.

19. The method of claim 18 wherein said reactive ion etching comprises reactive ion etching without sidewall passivation.

20. The method of claim 1 wherein said etching of said lateral trenches comprises isotropic dry etching.

21. The method of claim 1 wherein said etching of said main vertical trench is simultaneous with said etching of said lateral trenches.

22. A capacitor having increased capacitance produced by:
   forming alternating first and second silicon regions, said first silicon region having different etch characteristics from said second silicon region;
   dry etching a main vertical trench in said capacitor by etching vertically through said first and said second silicon regions; and
   dry etching lateral trenches off said main vertical trench by selectively laterally dry etching one of said first and said second silicon regions, thereby increasing surface area of said capacitor so as to increase capacitance of said capacitor.

23. The capacitor of claim 22 wherein said first silicon region comprises p-doped silicon and said second silicon region comprises n-doped silicon.

24. The capacitor of claim 22 wherein said first silicon region comprises p-doped silicon and said second silicon region comprises p-doped silicon which is also n-doped.

25. The capacitor of claim 22 wherein said first silicon region comprises n-doped silicon and said second silicon region comprises undoped silicon.

* * * * *